(12) United States Patent
Kondo et al.

(10) Patent No.: US 10,127,958 B2
(45) Date of Patent: Nov. 13, 2018

(54) MAGNETIC MEMORY

(71) Applicant: TOSHIBA MEMORY CORPORATION, Tokyo (JP)

(72) Inventors: Tsuyoshi Kondo, Kanagawa (JP); Takuya Shimada, Kanagawa (JP); Yasuaki Ootera, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 18 days.

(21) Appl. No.: 15/443,299

(22) Filed: Feb. 27, 2017

(65) Prior Publication Data

US 2018/0025763 A1 Jan. 25, 2018

(30) Foreign Application Priority Data

Jul. 22, 2016 (JP) ................ P2016-144743

(51) Int. Cl.
*H01L 43/02* (2006.01)
*G11C 11/16* (2006.01)
(Continued)

(52) U.S. Cl.
CPC .......... *G11C 11/161* (2013.01); *H01L 27/224* (2013.01); *H01L 43/02* (2013.01);
(Continued)

(58) Field of Classification Search
CPC .............. G11C 11/161; G11C 11/1672; G11C 11/1675; H01L 43/08; H01L 43/02; H01L 27/224
See application file for complete search history.

(56) References Cited

U.S. PATENT DOCUMENTS

| 2011/0069541 A1 | 3/2011 | Ono et al. |
| 2015/0295166 A1 | 10/2015 | Suzuki |
| 2016/0224242 A1 | 8/2016 | Kondo et al. |

FOREIGN PATENT DOCUMENTS

| JP | 2004-288844 | 10/2004 |
| JP | 5486731 | 5/2014 |
| WO | WO 2009/130738 A1 | 10/2009 |

OTHER PUBLICATIONS

Fukami, S., et al., "Magnetization switching by spin-orbit torque in an antiferromagnet-ferromagnet bilayer system", Nature Materials, pp. 1-8 (2016).

(Continued)

*Primary Examiner* — Long Pham
(74) *Attorney, Agent, or Firm* — Finnegan, Henderson, Farabow, Garrett & Dunner, L.L.P.

(57) ABSTRACT

According to one embodiment, the magnetic memory includes a structure including a first magnetic layer and a conductive layer, a second magnetic layer, an intermediate layer, a third magnetic layer, and a fourth magnetic layer. The first magnetic layer is provided between the second magnetic layer and the conductive layer. The intermediate layer is provided between the second magnetic layer and the first magnetic layer. The third magnetic layer is provided between a second electrode and the intermediate layer. The fourth magnetic layer is provided between a first electrode and the intermediate layer. Further, the magnetic memory includes a first conductive-type first semiconductor layer electrically connected with the first electrode, a first conductive-type second semiconductor layer electrically connected with the second magnetic layer, and a second conductive-type third semiconductor layer electrically connected with the first semiconductor layer and the second semiconductor layer.

17 Claims, 11 Drawing Sheets

(51) Int. Cl.
H01L 43/08 (2006.01)
H01L 27/22 (2006.01)
(52) U.S. Cl.
CPC .......... *H01L 43/08* (2013.01); *G11C 11/1673* (2013.01); *G11C 11/1675* (2013.01)

(56) References Cited

OTHER PUBLICATIONS

Liu, L., et al., "Current-Induced Switching of Perpendicularly Magnetized Magnetic Layers Using Spin Torque from the Spin Hall Effect", Physical Review Letters, vol. 109, pp. 096602-1-096602-5, American Physical Society (2012).

Cubukcu, M., et al., "Spin-orbit torque magnetization switching of a three-terminal perpendicular magnetic tunnel junction", Applied Physics Letters, vol. 104, pp. 042406-1-042406-5 (2014).

Zhao, Z., et al., "Spin Hall switching of the magnetization in Ta/TbFeCo structures with bulk perpendicular anisotropy", Applied Physics Letters, vol. 106, pp. 132404-1-132404-4 (2015).

Kondo, T., et al., U.S. Appl. No. 15/260,517, "Magnetic Memory and Method for Manufacturing Same", filed Sep. 6, 2016.

MAGNETIC MEMORY

CROSS-REFERENCE TO RELATED APPLICATIONS

This application is based upon and claims the benefit of priority from Japanese Patent Application No. 2016-144743 filed on Jul. 22, 2016, the entire contents of which are incorporated herein by reference.

FIELD

Embodiments describe herein relate generally to a magnetic memory.

BACKGROUND

Recently a three terminal magnetic random access memory (MRAM; Magnetic Random Access Memory) using torque which is originally caused by spin-orbit interaction has been proposed. In magnetic memories including such MRAM, improvement of the degree of integration (i.e. high integration) has been desired.

DESCRIPTION OF EMBODIMENTS

According to one embodiment of the present invention, a magnetic memory includes a structure including a first magnetic layer and a conductive layer, a second magnetic layer, an intermediate layer, a third magnetic layer, and a fourth magnetic layer is provided. The first magnetic layer is provided between the second magnetic layer and the conductive layer. The intermediate layer is provided between the second magnetic layer and the first magnetic layer. The third magnetic layer is provided between a second electrode and the intermediate layer. The fourth magnetic layer is provided between a first electrode and the intermediate layer. The magnetic memory includes a first semiconductor layer having a first conductive-type electrically connected with the first electrode, a second semiconductor layer having a first conductive-type electrically connected with the second magnetic layer, and a third semiconductor layer having a second conductive-type electrically connected with the first semiconductor layer and the second semiconductor layer.

Hereinafter, embodiments of the present invention will be described with reference to the drawings.

Note that the drawings are schematically and conceptually illustrated. Relationship between the thickness and the width of portions, a ratio of sizes between the portions, and the like are not necessarily the same as those in reality. Further, dimensions and ratios may be different from each other depending on the drawings even if these drawings illustrate the same portion.

Note that, in the specification and the drawings of the present application, an element similar to that described in relation to a previously described drawing is denoted with the same reference sign and detailed description is appropriately omitted.

(First Embodiment)

Figure 1:
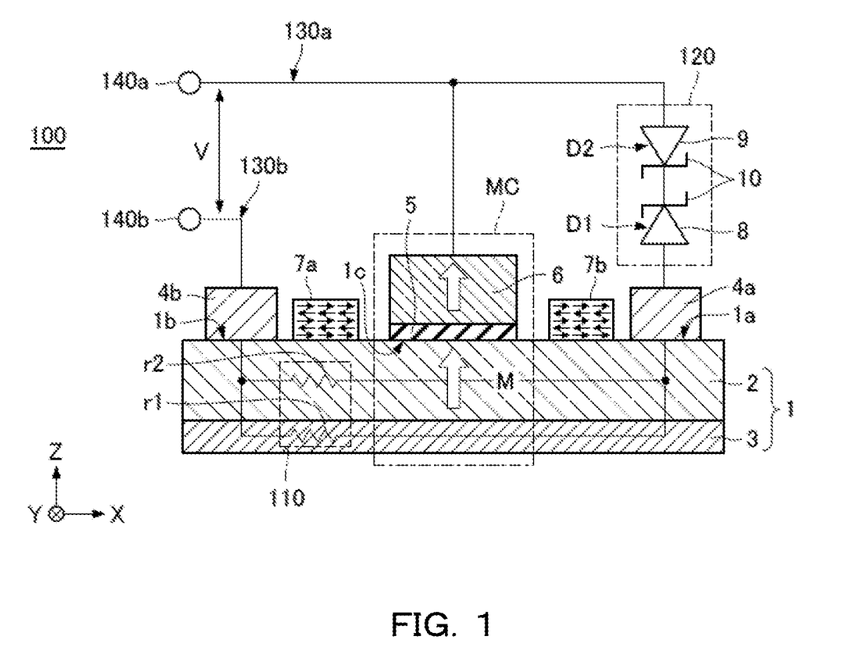
FIG. 1 is a schematic sectional view illustrating a magnetic memory according to a first embodiment.

FIG. 1 is a schematic sectional view illustrating a magnetic memory according to a first embodiment.

As illustrated in FIG. 1, a magnetic memory 100 according to the first embodiment includes a structure 1. The structure 1 includes a first magnetic layer 2 and a conductive layer 3. A first electrode 4a is provided on a first portion 1a of the structure 1. A second electrode 4b is provided on a second portion 1b of the structure 1. The second portion 1b is distant from the first portion 1a.

In the example of FIG. 1, the first portion 1a is on the first magnetic layer 2. However, in the present embodiment, the first portion 1a may be on the conductive layer 3, or may be on the first magnetic layer 2 and the conductive layer 3. The second portion 1b also may be on the conductive layer 3, or may be on the first magnetic layer 2 and the conductive layer 3. The conductive layer 3 is nonmagnetic. The conductive layer 3 includes a conductor having large spin-orbit interaction, for example. Examples of such conductor may include tantalum (Ta) and platinum (Pt).

In the present specification, one direction is defined as an X direction. One direction vertical to the X direction is defined as a Y direction. A direction perpendicular to the X direction and the Y direction is defined as a Z direction.

The magnetic memory 100 is formed on, for example, a semiconductor substrate. For example, a main surface of the semiconductor substrate is an XY plane. In FIG. 1, the semiconductor substrate is omitted and not illustrated.

An intermediate layer (insulating layer) 5 is provided on the first magnetic layer 2 of the structure 1. The first magnetic layer 2 includes a third portion 1c between the first portion 1a and the second portion 1b.

In the present embodiment, the intermediate layer (insulating layer) 5 is provided on the third portion 1c of the first magnetic layer 2. A second magnetic layer 6 is provided on the intermediate layer (insulating layer) 5. The intermediate layer (insulating layer) 5 is sandwiched by the first magnetic layer 2 and the second magnetic layer 6, and is arranged therebetween. The first magnetic layer 2, the intermediate layer (insulating layer) 5, and the second magnetic layer 6 form magnetic tunnel junction (MTJ).

A memory cell MC of the magnetic memory 100 includes the first magnetic layer 2, the intermediate layer (insulating layer) 5, and the second magnetic layer 6. Such memory cell MC is, for example, an MTJ storage element.

The second magnetic layer 6 is a reference layer. The direction of magnetization of the reference layer (second magnetic layer 6) is fixed (or pinned) to one of "upward" and "downward" directions, for example. In the present embodiment, the direction of magnetization of the reference layer (second magnetic layer 6) is fixed (or pinned) to the upward direction. In the example of FIG. 1, the direction of magnetization goes along the Z direction. In the embodiment, the direction of magnetization may intersect with the Z direction and is arbitrary. Description will be given, where the direction of magnetization is "upward" or "downward", for convenience.

The first magnetic layer 2 is a magnetic recording layer. A direction of magnetization M of the magnetic recording layer (first magnetic layer 2) is variable to either one of the "upward" direction and the "downward" direction. FIG. 1 illustrates a case in which the direction of magnetization M is the "upward" direction. A state in which the direction of magnetization M of the magnetic recording layer (first magnetic layer 2) is the "upward direction" and the direction of magnetization of the reference layer (second magnetic layer 6) is the "upward" direction is a parallel state. In the parallel state, a resistance value of the MTJ is low.

On the other hand, a state in which the direction of magnetization M of the magnetic recording layer (first magnetic layer 2) is the "downward" direction, and the direction of magnetization of the reference layer (second magnetic layer 6) is the "upward" direction is an antiparallel state. In the antiparallel state, the resistance value of the MTJ is high. Information (data) is recorded in the memory cell MC according the resistance value of the MTJ.

A third magnetic layer 7a and a fourth magnetic layer 7b are provided in contact with the first magnetic layer 2 on the first magnetic layer 2 side of the structure 1. In the present embodiment, the third magnetic layer 7a is provided between the second electrode 4b and the intermediate layer (insulating layer) 5 in contact with the first magnetic layer 2. Further, the fourth magnetic layer 7b is provided between the first electrode 4a and the intermediate layer (insulating layer) 5 in contact with the first magnetic layer 2.

That is, the second electrode 4b, the third magnetic layer 7a, the intermediate layer (insulating layer) 5, the fourth magnetic layer 7b, and the first electrode 4a are lined up in a first direction (here, a direction along an X axis).

The third magnetic layer 7a and the fourth magnetic layer 7b are antiferromagnetic or ferromagnetic. The directions of magnetization of the third magnetic layer 7a and the fourth magnetic layer 7b are fixed (or pinned).

In the present embodiment, the directions of the magnetization of the third magnetic layer 7a and the fourth magnetic layer 7b go along the X direction. The third magnetic layer 7a and the fourth magnetic layer 7b are in contact with the first magnetic layer (magnetic recording layer) 2, and are exchange coupled.

In a case where the third magnetic layer 7a and the fourth magnetic layer 7b are antiferromagnetic, an effect (called exchange bias) to direct the magnetization of the first magnetic layer (magnetic recording layer) 2 to a direction of magnetization along the X direction, of surfaces of the third magnetic layer 7a and the fourth magnetic layer 7b, the surfaces being in contact with the first magnetic layer (magnetic recording layer) 2, is caused. A similar effect is caused even in a case where the third magnetic layer 7a and the fourth magnetic layer 7b are ferromagnetic.

However, antiferromagnetism is desirable because the third magnetic layer 7a and the fourth magnetic layer 7b become strong against disturbance due to an external magnetic field. The exchange bias is used to reverse the direction of magnetization of the first magnetic layer 2 to a determined direction in writing information.

The third magnetic layer 7a and the fourth magnetic layer 7b determine a direction to be reversed to change the parallel state to the antiparallel state when a current is caused to flow in the first magnetic layer (magnetic recording layer 2) from the right to the left on FIG. 1 along the X direction.

When a current flows in the conductive layer 3, a spin current occurs in the conductive layer 3. When the spin current occurs in the conductive layer 3, a spin is injected from the conductive layer 3 to the first magnetic layer (magnetic recording layer) 2. The direction of magnetization M of the first magnetic layer (magnetic recording layer) 2 is determined according to whether the direction of the spin injected from the conductive layer 3 is the "upward" or "downward" direction. The direction of the spin injected from the conductive layer 3 can be determined according to the direction of the current flowing in the conductive layer 3. In writing information, the magnetic memory 100 injects the spin from the conductive layer 3 to the first magnetic layer (magnetic recording layer) 2. Such a writing method is, for example, a spin injection method.

The first electrode 4a is connected with the second electrode 4b through a parallel circuit 110. The parallel circuit 110 includes a first resistor portion r1 by the conductive layer 3 and a second resistor portion r2 by the first magnetic layer 2. A resistance value of the first resistor portion r1 is lower than a resistance value of the second resistor portion r2.

The magnetic memory 100 includes a circuit element 120. The circuit element 120 includes a first semiconductor layer 8 having a first conductive-type, a second semiconductor layer 9 having a first conductive-type, and a third semiconductor layer 10 having a second conductive-type. The first semiconductor layer 8 is electrically connected with the first electrode 4a. The second semiconductor layer 9 is electrically connected with the second magnetic layer 6. The third semiconductor layer 10 is electrically connected with the first semiconductor layer 8 and the second semiconductor layer 9.

In the present embodiment, the first semiconductor layer 8 and the second semiconductor layer 9 are p-type, and the third semiconductor layer 10 is n-type, for example. The first semiconductor layer 8 and the second semiconductor layer 9 are anodes of diodes. The third semiconductor layers 10 are cathodes of the diodes. The circuit element 120 includes diodes D1 and D2. The cathode of the diode D1 is connected with the cathode of the diode D2. In the present embodiment, the cathodes of the diodes D1 and D2 are connected. Instead, the anodes of the diodes D1 and D2 could be connected. The diodes D1 and D2 are, for example, a Zener diode.

The magnetic memory 100 includes first wiring 130a, second wiring 130b, a first external terminal 140a, and a second external terminal 140b. The first external terminal 140a is electrically connected with the first wiring 130a. The first wiring 130a is electrically connected with the second magnetic layer 6 and the second semiconductor layer 9. The second external terminal 140b is electrically connected with the second wiring 130b. The second wiring 130b is electrically connected with the second electrode 4b. The first external terminal 140a and the second external terminal 140b are terminals connectable with an external circuit (not illustrated) outside the magnetic memory 100.

An example of the external circuits includes a circuit that includes a control device that controls information write and information read to/from the magnetic memory 100.

Hereinafter, an example of operations of the magnetic memory 100 will be described.

Figure 2:
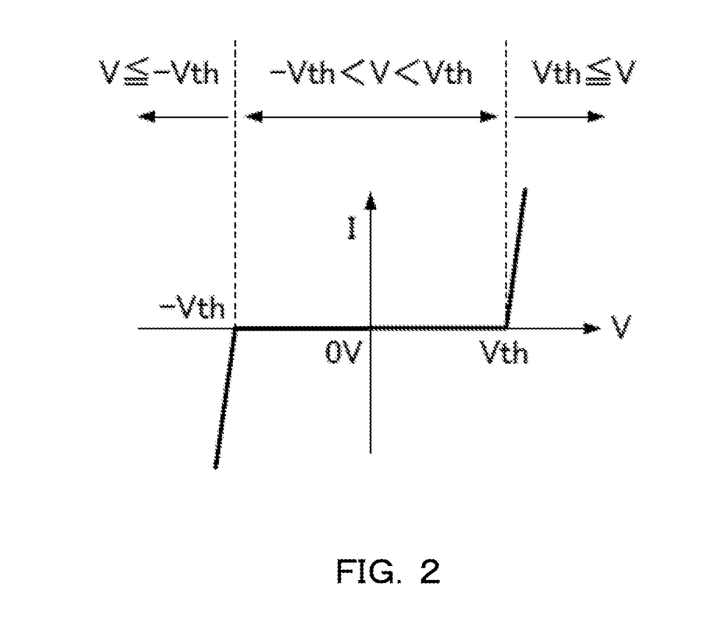
FIG. 2 is a schematic view illustrating characteristics of a part of the magnetic memory according to the first embodiment.

FIG. 2 is a schematic view illustrating characteristics of a part of the magnetic memory according to the first embodiment.

FIG. 2 illustrates current-voltage characteristics of the circuit element 120.

As illustrated in FIG. 2, the circuit element 120 has a positive threshold Vth and a negative threshold −Vth. A voltage provided between the first wiring 130a and the second wiring 130b refers to "voltage between wirings V". A current I does not flow in the circuit element 120 when the voltage between wirings V falls within a range of "−Vth<V<Vth" and is "V<|Vth|".

The current I flows in the circuit element 120 from the first wiring 130a to the second wiring 130b when the voltage between wirings V is "Vth≤V". The current I flows in the circuit element 120 from the second wiring 130b to the first wiring 130a when the voltage between wirings V is "V≤−Vth".

(Read Operation)

A read operation is performed where a voltage between wirings Vr is set to "Vr<|Vth|". External terminals to be used are, for example, the first external terminal 140a and the second external terminal 140b. In the read operation, a first potential difference is provided to the first external terminal 140a and the second external terminal 140b. The voltage between wirings Vr is set to "Vr<|Vth|" on the basis of the first potential difference.

Figure 3:
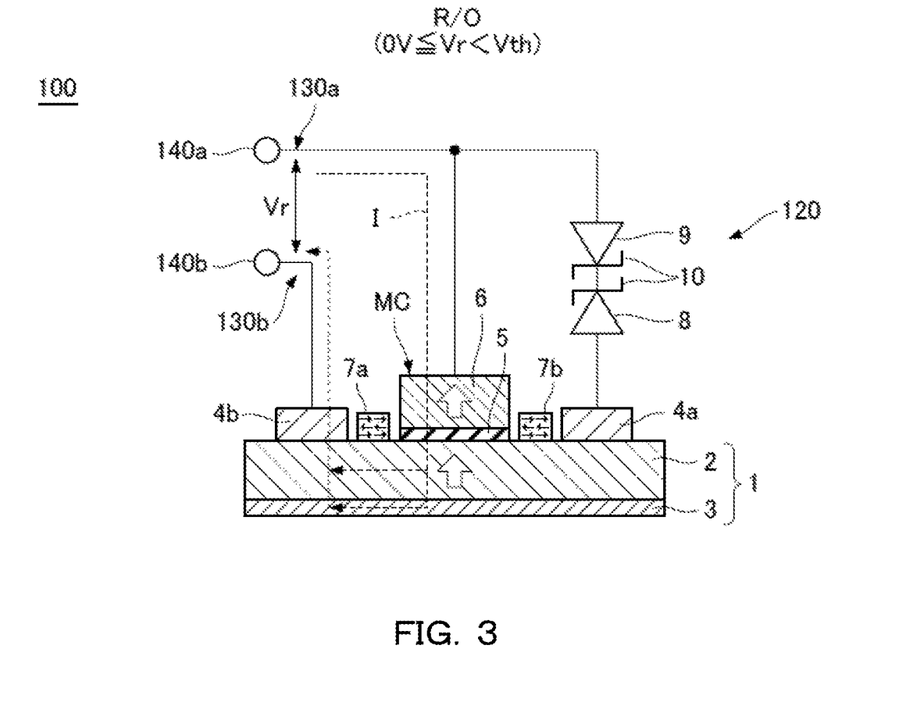
FIG. 3 is a schematic view to explain an operation of the magnetic memory according to the first embodiment.

FIG. 3 is a schematic view to explain an operation of the magnetic memory according to the first embodiment.

FIG. 3 exemplarily illustrates a read operation R/O of the magnetic memory 100.

FIG. 3 illustrates a case in which a positive potential is provided to the first wiring 130a, and a voltage lower than that of the first wiring 130a, for example, a ground potential (0 V) is provided to the second wiring 130b. The voltage between wirings Vr is "0V≤Vr<Vth". In this case, the current I flows from the first wiring 130a to the second wiring 130b through the memory cell MC. The value of the current I is changed according to a resistance value of the memory cell MC. The value of the current I becomes large when the resistance value of the memory cell MC is low, and the value of the current I becomes small when the resistance value of the memory cell MC is high. Whether information recorded in the memory cell MC is "1" or "0" is determined on the basis of the magnitude of the value of the current I, for example.

In the magnetic memory 100, voltage drop of the memory cell MC can be higher than the voltage between wirings Vr. In this case, the current I does not flow. Whether the information recorded in the memory cell MC is "0" or "1" is determined on the basis of whether the current I flows, for example.

In the example of the read operation R/O illustrated in FIG. 3, the potential of the second wiring 130b is lower than the potential of the first wiring 130a. However, the potential of the second wiring 130b can be higher than the potential of the first wiring 130a. In this case, the current I flows from the second wiring 130b to the first wiring 130a through the memory cell MC. To be specific, a positive potential is provided to the second wiring 130b, and 0 V is provided to the first wiring 130a. Alternatively, 0 V is provided to the second wiring 130b, and the negative potential is provided to the first wiring 130a. Even in this case, whether the information is "1" or "0" is determined on the basis of the magnitude of the value of the current I, or whether the current I flows.

(Write Operation)

A write operation is performed where a voltage between wirings Vw is set to "Vth≤Vw" or "−Vw≤−Vth" according to information to be written. External terminals to be used are, for example, the first external terminal 140a and the second external terminal 140b. In the write operation, a second Potential difference is provided to the first external terminal 140a and the second external terminal 140b. The voltage between wirings Vw is set to "Vth≤Vw" or "−Vw≤−Vth" on the basis of the second potential difference.

Figure 4:
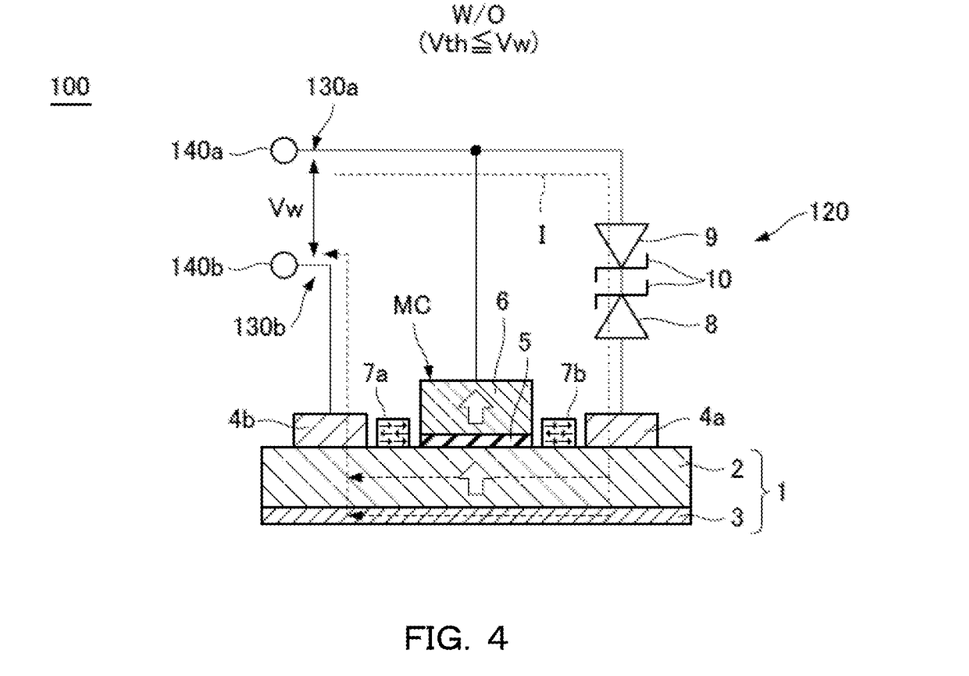
FIG. 4 is a schematic view to explain an operation of the magnetic memory according to the first embodiment.

FIG. 4 is a schematic view to explain an operation of the magnetic memory according to the first embodiment.

FIG. 4 exemplarily illustrates a write operation W/O of the magnetic memory 100. FIG. 4 illustrates a case in which the voltage between wirings Vw is "Vth≤Vw".

The state illustrated in FIG. 4 is obtained by, for example, providing a positive potential of the positive threshold Vth or more to the first wiring 130a, and providing the ground potential (0 V) to the second wiring 130b. The current I flows from the first wiring 130a to the second wiring 130b through the circuit element 120. In this case, the current I flows in the conductive layer 3 from the first electrode 4a to the second electrode 4b. Accordingly, the spin is injected from the conductive layer 3 to the first magnetic layer 2. For example, the direction of magnetization of the first magnetic layer 2 becomes the "upward" direction, and information corresponding to the parallel state is written in the memory cell MC.

Figure 5:
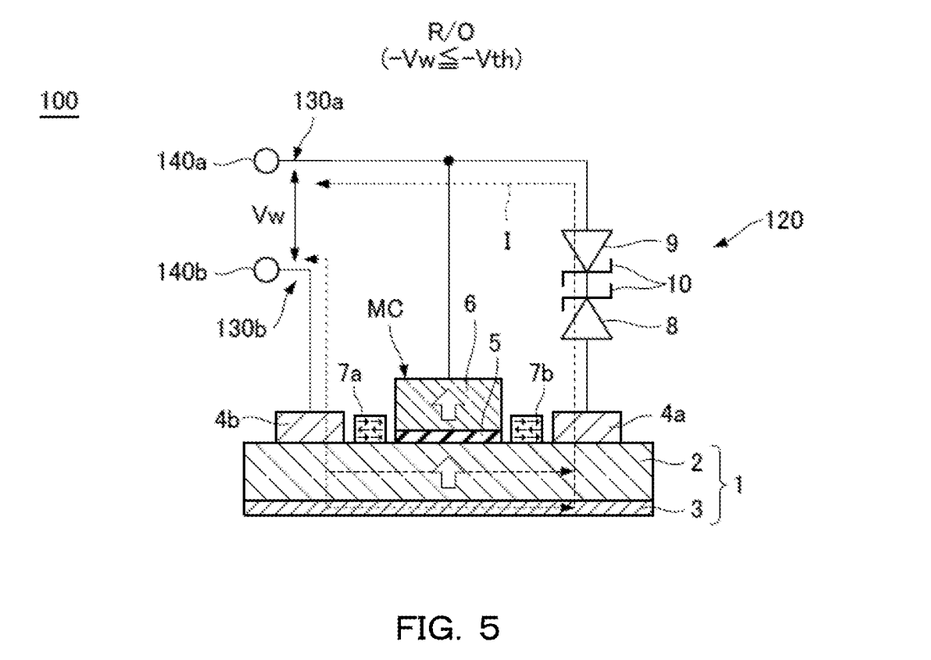
FIG. 5 is a schematic view to explain an operation of the magnetic memory according to the first embodiment.

FIG. 5 is a schematic view to explain an operation of the magnetic memory according to the first embodiment.

FIG. 5 exemplarily illustrates the write operation W/O of the magnetic memory 100. FIG. 5 illustrates a case in which the voltage between wirings Vw is "−Vw≤−Vth".

The state illustrated in FIG. 5 can be obtained by, for example, providing the ground potential (0 V) to the first wiring 130a, and providing a positive potential of the positive threshold Vth or more to the second wiring 130b. Alternatively, the state illustrated in FIG. 5 is obtained by providing the negative potential of the negative threshold −Vth or less to the first wiring 130a, and providing the ground potential (0 V) to the second wiring 130b. The current I flows from the second wiring 130b to the first wiring 130a through the circuit element 120.

In this case, the current I flows in the conductive layer 3 from the second electrode 4b to the first electrode 4a. Accordingly, the spin in a reverse direction to the state illustrated in FIG. 4 is injected from the conductive layer 3 to the first magnetic layer 2. For example, the direction of magnetization of the first magnetic layer 2 becomes the "downward" direction, and information corresponding to the antiparallel state is written to the memory cell MC.

When the magnetic memory 100 performs the read operation R/O, for example, the first potential difference is provided to the first external terminal 140a and the second external terminal 140b. The magnetic memory 100 performs the read operation R/O on the basis of the first potential difference.

The second potential difference is provided to the first external terminal 140a and the second external terminal 140b when the magnetic memory 100 performs the write operation W/O. The magnetic memory 100 performs the write operation W/O on the basis of the second potential difference.

Therefore, the magnetic memory 100 may not differently use the external terminals between in the read operation R/O and in the write operation W/O. Therefore, the number of the external terminals according to the first embodiment can be reduced, compared with a magnetic memory 100 that differently uses the external terminals between in the read operation R/O and in the write operation W/O.

At least a part of the third magnetic layer 7a and the fourth magnetic layer 7b overlaps with at least a part of an area between the first portion 1a and the second portion 1b in a direction intersecting with a direction connecting the first portion 1a and the second portion 1b. Therefore, the magnetic memory 100 can record a plurality of pieces of information in the second magnetic layer 6 between the first portion 1a and the second portion 1b of the structure 1.

Further, the first wiring 130a is provided the potential not only when the read operation R/O is performed but also when the write operation W/O is performed. Therefore, in a memory cell array in which the memory cells MC are integrated, wiring for the read operation R/O and wiring for the write operation W/O may not be separately provided. Therefore, the degree of integration of the memory cell array in the magnetic memory 100 can be improved, compared with a magnetic memory provided with the wiring for the read operation R/O and the wiring for the write operation W/O in the memory cell array.

A higher TMR ratio is required for the memory cell MC. Accordingly, design/manufacturing margin of the magnetic memory 100 is increased. To obtain the high TMR ratio, a difference between the resistance values is increased between a high resistance state and a low resistance state. However, if the resistance value in the high resistance state is made too high, the current becomes less flowable in the memory cell MC during the write operation W/O, and the write characteristics of the memory cell MC are degraded.

Under in the circumstances, the magnetic memory 100 does not allow the current to flow in the memory cell MC during the write operation W/O. Therefore, the resistance value in the high resistance state can be increased without degrading the write characteristics, compared with a case in which the current flows in the memory cell MC during the write operation W/O. Therefore, in the magnetic memory 100, the design/manufacturing margin can be increased.

The magnetic memory 100 can write information when the voltage between wirings Vw becomes the positive threshold Vth or more, or the negative threshold −Vth or more, of the circuit element 120, regardless of the resistance value of the memory cell MC. Therefore, the resistance value of the memory cell MC can be increased to a value with which no conduction is performed with the voltage between wirings Vw provided in the write operation W/O.

As described above, according to the magnetic memory 100 of the first embodiment, a magnetic memory that enables improvement of the degree of integration can be provided. Further, for example, the number of the external terminals can be reduced. Further, for example, the design/manufacturing margin can be increased.

(Second Embodiment)

A second embodiment relates to an example of a case in which the magnetic memory 100 according to the first embodiment is applied to a magnetic domain wall motion memory.

Figure 6:
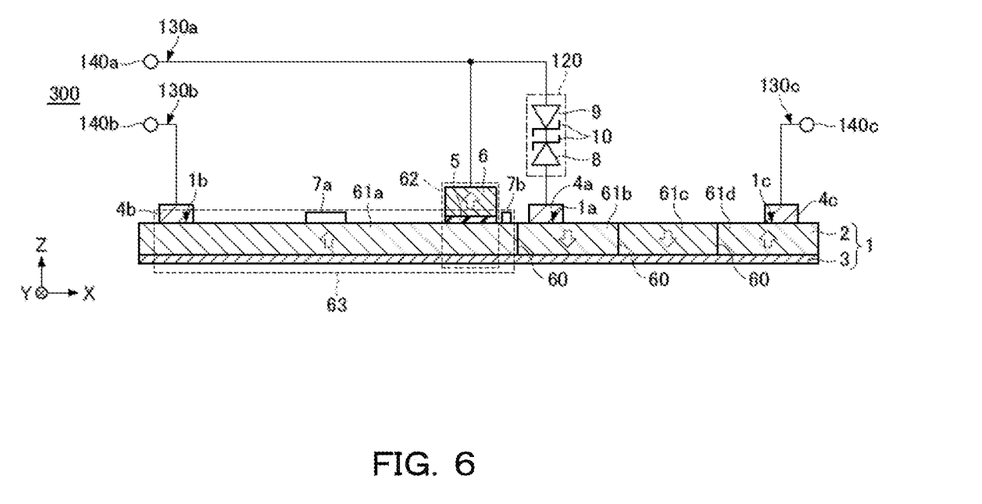
FIG. 6 is a schematic sectional view illustrating a magnetic memory according to a second embodiment.

FIG. 6 is a schematic sectional view illustrating a magnetic memory according to the second embodiment.

A magnetic memory 300 according to the second embodiment is an example in which a third electrode 4c is further provided to the magnetic memory 100 illustrated in FIG. 1. The third electrode 4c is provided on a third portion 1c of a structure 1. Third wiring 130c is electrically connected to the third electrode 4c. The third wiring 130c is electrically connected to a third external terminal 140c.

The magnetic memory 300 including the third electrode 4c on the structure 1 can be used as a magnetic domain wall motion memory including a first magnetic layer 2 as a magnetic recording layer. A magnetic domain wall 60 is caused in the first magnetic layer 2 to cross the first magnetic layer 2. In moving the magnetic domain wall 60, a first shift current Isf1 from a second electrode 4b to the third electrode 4c is caused to flow in at least the first magnetic layer 2. Alternatively, a second shift current Isf2 from the third electrode 4c to the second electrode 4b is caused to flow in at least the first magnetic layer 2. The first shift current Isf1 and the second shift current Isf2 flow in the first magnetic layer 2, penetrating the magnetic domain wall 60.

In a case where the first shift current Isf1 flows, the magnetic domain wall 60 is shifted, for example, to the right on the sheet surface. In a case where the second shift current Isf2 flows, the magnetic domain wall 60 is shifted, for example, to the left on the sheet surface.

Magnetic domains 61 are set to the first magnetic layer 2 by the magnetic domain wall 60, for example. A plurality of the magnetic domains 61 may be provided to the first magnetic layer 2. The direction of magnetization may simply be changed on the right and left of one magnetic domain wall 60.

In this case, the magnetic domain wall 60 caused in the first magnetic layer 2 is shifted either to the right or left below an intermediate layer (insulating layer) 5. Accordingly, information "1" or information "0" can be stored.

However, if the magnetic domains 61 divided by the magnetic domain walls 60 are set to the first magnetic layer 2, for example, a plurality of two or more pieces of information (data) can be recorded in the first magnetic layer 2. FIG. 6 illustrates an example in which four magnetic domains 61a, 61b, 61c, and 61d are set to the first magnetic layer 2.

In this case, the four pieces of information can be recorded in the first magnetic layer 2.

The magnetic memory 300 is, for example, a magnetic domain wall motion memory. The magnetic memory 300 includes a read head 62 and a write head 63.

The read head 62 includes the first magnetic layer 2, the intermediate layer (insulating layer) 5, and a second magnetic layer 6. The direction of magnetization of the second magnetic layer 6 is fixed (or pinned) similarly to the first embodiment. In the present embodiment, the direction is fixed (or pinned) to an "upward" direction.

The write head 63 includes the first magnetic layer 2, a conductive layer 3, a third magnetic layer 7a, and a fourth magnetic layer 7b. The third magnetic layer 7a and the fourth magnetic layer 7b provide a bias magnetic field for inverting the direction of magnetization of the first magnetic layer 2 to the first magnetic layer 2 and the conductive layer 3.

Hereinafter, an example of a read operation R/O, a shift operation, and a write operation W/O of the magnetic memory 300 will be described.

(Read Operation)

The read operation R/O is performed where a voltage between wirings Vr is set to "Vr<|Vth|".

Figure 7:
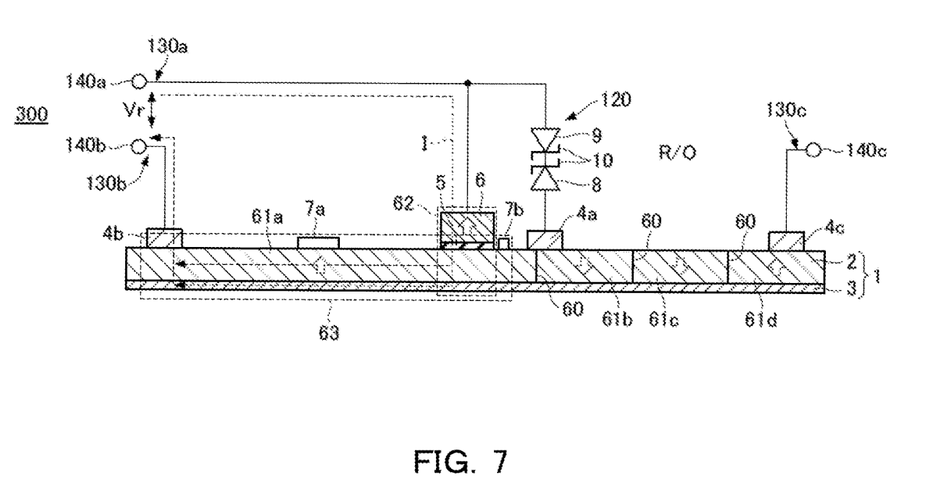
FIG. 7 is a schematic view to explain an operation of the magnetic memory according to the second embodiment.

FIG. 7 is a schematic view to explain an operation of the magnetic memory according to the second embodiment.

FIG. 7 exemplarily illustrates the read operation R/O of the magnetic memory 300.

As illustrated in FIG. 7, the read operation R/O is similar to that of the magnetic memory 100 according to the first embodiment. The voltage between wirings Vr is "Vr<|Vth|". Whether information recorded in the magnetic recording layer (first magnetic layer 2) is "1" or "0" is determined according to the magnitude of a value of a current I flowing in the read head 62, for example. Alternatively, whether the information is "1" or "0" is determined according to whether the current I flows in the read head 62, for example. External terminals to be used are a first external terminal 140a and a second external terminal 140b.

(Write Operation)

The write operation W/O is performed where a voltage between wirings Vw is set to "Vth≤Vw" or "−Vw≤−Vth" according to information to be written.

Figure 8:
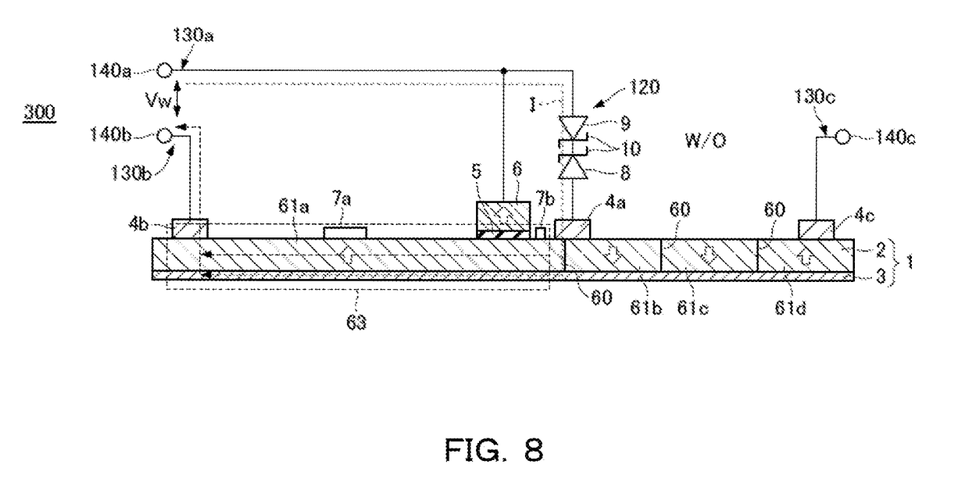
FIG. 8 is a schematic view to explain an operation of the magnetic memory according to the second embodiment.

FIG. 8 is a schematic view to explain an operation of the magnetic memory according to the second embodiment.

FIG. 8 exemplarily illustrates the write operation W/O of the magnetic memory 300.

As illustrated in FIG. 8, the write operation W/O is similar to that of the magnetic memory 100 according to the first embodiment. The voltage between wirings Vw is set to be "Vth≤Vw" or "−Vw≤−Vth" according to the information to be written. "Vth≤Vw" is a case in which a potential of the first wiring 130a is made higher than a potential of the second wiring 130b. "−Vw≤−Vth" is a case in which the potential of the first wiring 130a is made lower than the potential of the second wiring 130b. The potential of the second wiring 130b is fixed to a ground potential (for example, 0 V), and the potential of the first wiring 130a is set to a positive potential or a negative potential according to the information to be written.

Alternatively, the potential of the second wiring 130b and the potential of the first wiring 130a are swapped according to the information to be written. Accordingly, a spin is injected from the conductive layer 3 to any of the magnetic domains 61a to 61d in the write head 63, and the direction of magnetization is determined. The direction of magnetization is determined according to the direction of the current I flowing in the conductive layer 3.

(Shift Operation)

The shift operation is performed where a voltage between wirings Vsf is set to "Vw<Vsf" or "−Vsf<−Vw" according to the direction into which the information is shifted. The voltage between wirings Vsf is a voltage between the second wiring 130b and the third wiring 130c. The external terminals to be used are the second external terminal 140b and the third external terminal 140c. For example, in the shift operation, a third potential difference is provided to the second external terminal 140b and the third external terminal 140c. The voltage between wirings Vsf is set to "Vw<Vsf" or "−Vsf<−Vw" on the basis of the third potential difference.

Figure 9:
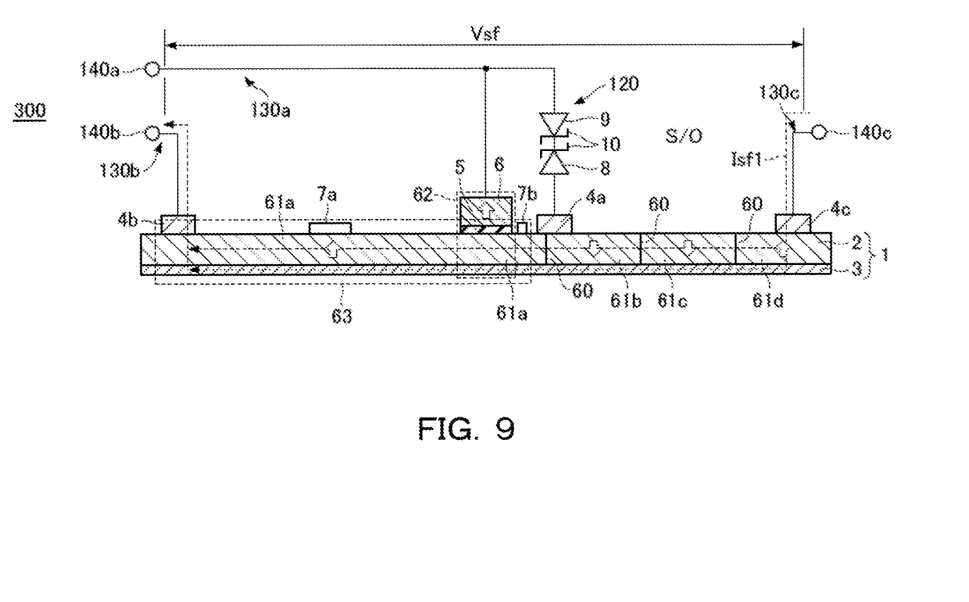
FIG. 9 is a schematic view to explain an operation of the magnetic memory according to the second embodiment.

FIG. 9 is a schematic view to explain an operation of the magnetic memory according to the second embodiment.

FIG. 9 exemplarily illustrates the shift operation S/O of the magnetic memory 300. FIG. 9 illustrates a case in which the voltage between wirings Vsf is set to "Vw<Vsf".

"Vw<Vsf" is a case in which a potential of the third wiring 130c is made higher than the potential of the second wiring 130b. "−Vsf<−Vw" is a case in which the potential of the third wiring 130c is made lower than the potential of the second wiring 130b. In the shift operation S/O, for example, the potential of the second wiring 130b is set to the ground potential (for example, 0 V), and the potential of the third wiring 130c is set to the positive potential or the negative potential according to the direction into which the information is shifted. Alternatively, the potential of the second wiring 130b and the potential of the third wiring 130c are swapped according to the direction into which the information is shifted.

When "Vw<Vsf", the first shift current Isf1 flows from the third electrode 4c to the second electrode 4b through the first magnetic layer 2 and the conductive layer 3 (see FIG. 9). When the first shift current Isf1 flows in the first magnetic layer 2, penetrating the magnetic domain wall 60, the magnetic domain wall 60 is shifted from the third electrode 4c side to the second electrode 4b side. The magnetic domains 61a to 61d are shifted from the third electrode 4c to the second electrode 4b.

When "−Vsf<Vw", the second shift current Isf2 in the reverse direction flows from the second electrode 4b to the third electrode 4c through the first magnetic layer 2 and the conductive layer 3 (the second shift current Isf2 is not especially illustrated). When the second shift current Isf2 flows in the first magnetic layer 2, penetrating the magnetic domain wall 60, the magnetic domain wall 60 is shifted from the second electrode 4b side to the third electrode 4c side. The magnetic domains 61a to 61d are shifted from the second electrode 4b to the third electrode 4c.

The voltages between wirings Vsf and −Vsf are provided, for example, by pulse forms. While the voltages between wirings Vsf and −Vsf are provided by the pulse forms, the first shift current Isf1 and the second shift current Isf2 flow. The magnetic domain wall is moved while the first shift current Isf1 and the second shift current Isf2 flow. A distance by which the magnetic domain wall 60 is moved in one pulse is a distance of one of the magnetic domains 61a to 61d, for example. However, the distance by which the magnetic domain wall 60 is moved in one pulse is not limited thereto.

FIG. 9 illustrates a case in which the magnetic domain 61b is in the read head 62 and the write head 63. In a case where the magnetic domain 61c is shifted to the read head 62 and the write head 63 from the magnetic domain 61b, for example, one pulse of the voltage between wirings Vsf is provided. Accordingly, the magnetic domain 61c is shifted to the read head 62 and the write head 63.

In a case where the magnetic domain 61a is shifted to the read head 62 and the write head 63 from the magnetic domain 61b, for example, one pulse of the voltage between wirings −Vsf is provided. Accordingly, the magnetic domain 61a is shifted to the read head 62 and the write head 63.

In the shift operation S/O, the magnetic domain in which information to be read is recorded, of the magnetic domains 61a to 61d, is shifted to the read head 62. Further, the magnetic domain to which the information is to be written, of the magnetic domains 61a to 61d, is shifted to the write head 63.

During the shift operation S/O, the first shift current Isf1 and the second shift current Isf2 flow not only in the first magnetic layer 2 but also in the conductive layer 3. The flowing of the current in the conductive layer 3 is similar to the write operation W/O. A different point is that whether the magnetic domain wall 60 is moved or stopped in the first magnetic layer 2. If the magnetic domain wall 60 is moved, spin injection to the first magnetic layer 2 is suppressed even if a current flows in the conductive layer 3.

In other words, during the write operation W/O, the magnetic domain wall 60 is stopped. Accordingly, the spin injection to the first magnetic layer 2 is facilitated. During the shift operation S/O, the magnetic domain wall 60 is moved.

Accordingly, the spin injection to the first magnetic layer 2 is suppressed. Whether the magnetic domain wall 60 remains stopped or is moved can be controlled by the magnitude of the current to flow in the first magnetic layer 2.

According to the magnetic memory 300 according to the second embodiment, a magnetic domain wall motion memory (hereinafter, referred to as a spin injection magnetic domain wall motion memory) in which a writing method for information is a spin injection method) is provided.

In the magnetic memory 300, the read operation R/O is performed on the basis of a first potential difference provided to the first external terminal 140a and the second external terminal 140b. The write operation W/O is performed on the basis of a second potential difference provided to the first external terminal 140a and the second external terminal 140b. Therefore, it is not necessary to use the external terminals differently between in the read operation R/O and in the write operation W/O. Therefore, the number of the external terminals of the spin injection magnetic domain wall motion magnetic memory can be reduced.

Similarly to the first embodiment, a special wiring for write is not necessary in a memory cell array in the magnetic memory 300. Therefore, in the spin injection magnetic domain wall motion memory, the degree of integration of the memory cell array can be improved.

The magnetic memory 300 does not allow a current to flow in the read head 62 during the write operation W/O.

Therefore, a resistance value of an MTJ element of the read head 62 can be increased without decreasing write characteristics. Therefore, in a spin injection magnetic domain wall motion memory, its design/manufacturing margin can be increased.

In another example of the present embodiment, the fourth magnetic layer 7b can be omitted. Then, the intermediate layer (insulating layer) 5, the first electrode 4a, the second electrode 4b, and the third magnetic layer 7a are lined up in the first direction (the direction along the X axis).

Hereinafter, modifications of the second embodiment will be described.

(Second Embodiment: First Modification)

Figure 10:
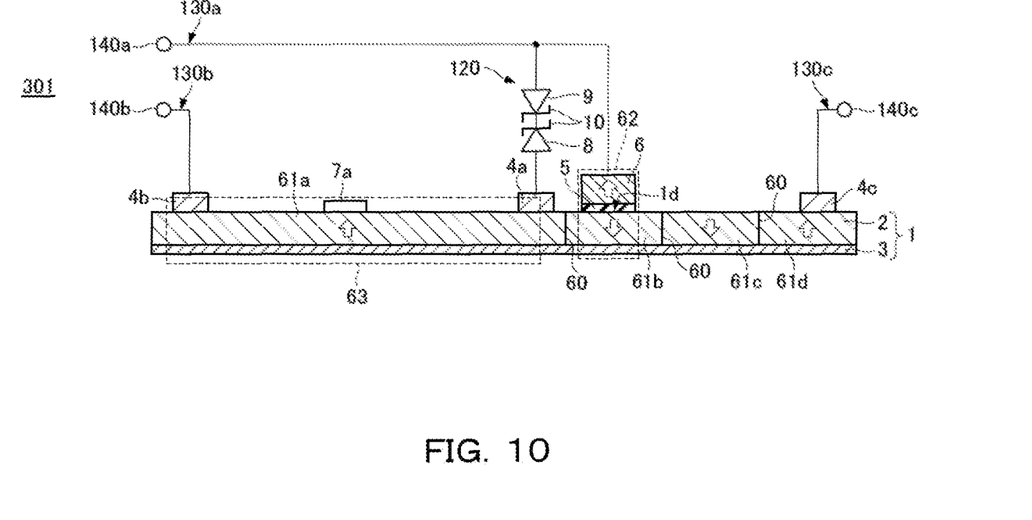
FIG. 10 is a schematic sectional view illustrating a magnetic memory according to a first modification of the second embodiment.

FIG. 10 is a schematic sectional view illustrating a magnetic memory according to a first modification of the second embodiment.

As illustrated in FIG. 10, a magnetic memory 301 according to a first modification is an example in which a read head 62 is provided in an area between a first electrode 4a and a third electrode 4c. An intermediate layer (insulating layer) 5 is provided on a fourth portion 1d of a structure 1, of the structure 1. The fourth portion 1d is between the first electrode 4a and the third electrode 4c.

As described above, the read head 62 is not necessarily provided in an area between the first electrode 4a and a second electrode 4b.

(Second Embodiment: Second Modification)

Figure 11:
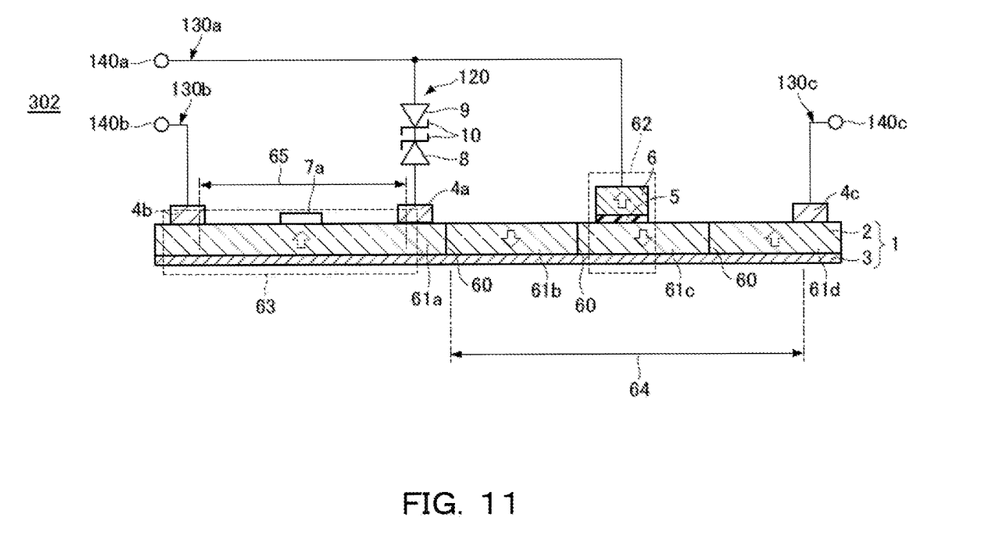
FIG. 11 is a schematic sectional view illustrating a magnetic memory according to a second modification of the second embodiment.

FIG. 11 is a schematic sectional view illustrating a magnetic memory according to a second modification of the second embodiment.

As illustrated in FIG. 11, a magnetic memory 302 according to the second modification has a read head 62 provided in an area between a first electrode 4a and a third electrode 4c, similarly to the magnetic memory 301 according to the first modification.

A different point is that an area between the read head 62 and the first electrode 4a is a storage area 64. The storage area 64 is an area in which a plurality of magnetic domains 61a to 61d of is shifted by a shift operation S/O. In this way, the magnetic memory 302 includes the storage area 64. The storage area 64 is provided between the read head 62 and the first electrode 4a.

Further, in the magnetic memory 302, a write head 63 is provided in a portion distant from the storage area 64.

Therefore, during a read operation R/O, the plurality of magnetic domains 61a to 61d are not shifted to the write head 63. Therefore, the plurality of magnetic domains 61a to 61d are less likely to be affected by magnetic fields of the third magnetic layer 7a and the fourth magnetic layer 7b.

During a write operation W/O, the plurality of magnetic domains 61a to 61d are shifted to the write area 65. In the magnetic memory 302, the write area 65 is set to an area between the first electrode 4a and a second electrode 4b.

In this way, the storage area 64 may be set between the read head 62 and the first electrode 4a. In this case, it is favorable to separate the write head 63 from, the storage area 64 from a perspective of retention of information.

According to the embodiment, a magnetic memory that enables improvement of the degree of integration can be provided.

The embodiments of the present invention have been described with reference to the specific examples. However, embodiments of the present invention limited to the specific examples. For example, specific configurations of the respective elements such as the first magnetic layer 2, the conductive layer 3, the intermediate layer (insulating layer) 5, the second magnetic layer 6, the third magnetic layer 7a, and the fourth magnetic layer 7b included in the magnetic memory can be appropriately selected from public domain by a person skilled in the art. Similar implementation of the present invention is included in the scope of the present invention as long as similar effects can be obtained.

Combinations of any two or more elements from the specific embodiments in a technically possible range are also included in the scope of the present invention as long as the combinations comprise the gist of the present invention.

In addition, all of magnetic storage elements and nonvolatile storage devices implementable through appropriate design change by a person skilled in the art on the basis of the magnetic memories described as the embodiments of the present invention also belong to the scope of the present invention as long as these elements and devices comprise the gist of the present invention.

In addition, various alternations and modifications that can be conceived by a person skilled in the art within the idea of the present invention are also understood to belong to the scope of the present invention.

Some embodiments of the present invention have been described. However, these embodiments have been presented as examples, and are not intended to limit the scope of the invention. These new embodiments can be implemented in various other forms, and various omissions, replacements, and changes can be made without departing from the gist of the invention. These embodiments and its modifications are included in the scope and the gist of the invention, and are included in the invention described in claims and its equivalents.

What is claimed is:

1. A magnetic memory comprising:
a structure including a first magnetic layer and a conductive layer;
a second magnetic layer having the first magnetic layer arranged between the second magnetic layer and the conductive layer;
an intermediate layer provided between the first magnetic layer and the second magnetic layer;
a first electrode electrically connected with a first portion of the structure;
a second electrode electrically connected with a second portion of the structure;

a third magnetic layer provided between the second electrode and the intermediate layer;

a fourth magnetic layer provided between the first electrode and the intermediate layer;

a first semiconductor layer having a first conductive-type, electrically connected with the first electrode;

a second semiconductor layer having a first conductive-type, electrically connected with the second magnetic layer; and a third semiconductor layer having a second conductive-type, electrically connected with the first semiconductor layer and the second semiconductor layer.

2. The magnetic memory according to claim 1, wherein the first electrode, the intermediate layer, the second electrode, the third magnetic layer, and the fourth magnetic layer are lined up in a first direction.

3. The magnetic memory according to claim 1, wherein the first electrode is connected with the second electrode by a parallel circuit including a first resistor portion by the conductive layer, and a second resistor portion by the first magnetic layer and connected in parallel to the first resistor portion.

4. The magnetic memory according to claim 2, wherein a resistance value of the first resistor portion is lower than a resistance value of the second resistor portion.

5. The magnetic memory according to claim 1, wherein the conductive layer is nonmagnetic.

6. The magnetic memory according to claim 1, wherein the third magnetic layer adds a magnetic field to the first magnetic layer.

7. The magnetic memory according to any claim 1, further comprising:

a first wiring electrically connected with the second magnetic layer and the second semiconductor layer; and a second wiring electrically connected with the second electrode.

8. The magnetic memory according to claim 7, further comprising:

a circuit element including the first semiconductor layer having a first conductive-type electrically connected with the first electrode, the second semiconductor layer having the first conductive-type electrically connected with the second magnetic layer, and the third semiconductor layer having the second conductive-type electrically connected with the first semiconductor layer and the second semiconductor layer, wherein the circuit element has a positive threshold voltage Vth and a negative threshold voltage −Vth, and a voltage Vr between the first wiring and the second wiring is Vr<|Vth| in a read operation, and a voltage Vw between the first wiring and the second wiring is Vth≤Vw or −Vw≤−Vth in a write operation.

9. The magnetic memory according to claim 8, further comprising:

a first external terminal; and a second external terminal, wherein the first external terminal is electrically connected with the first wiring, the second external terminal is electrically connected with the second wiring, a first potential difference is provided to the first external terminal and the second external terminal in the read operation, and a second potential difference is provided to the first external terminal and the second external terminal in the write operation.

10. The magnetic memory according to claim 1, further comprising:

a third electrode electrically connected with a third portion of the structure.

11. The magnetic memory according to claim 10, further comprising:

a third wiring electrically connected with the third electrode.

12. The magnetic memory according to claim 11, wherein first information and second information are written in the first magnetic layer.

13. The magnetic memory according to claim 12, wherein the first magnetic layer includes a first magnetic domain and a second magnetic domain, and the first information is written in the first magnetic domain, and the second information is written in the second magnetic domain.

14. The magnetic memory according to claim 13, wherein the first magnetic domain and the second magnetic domain are shifted in the first magnetic layer.

15. The magnetic memory according to claim 14, further comprising:

a third external terminal, wherein the third external terminal is electrically connected with the third wiring, and a third potential difference is provided to the second external terminal and the third external terminal in the shifting of the first magnetic domain and the second magnetic domain.

16. The magnetic memory according to claim 14, wherein the structure includes an area between the first electrode and the third electrode, and the first magnetic domain and the second magnetic domain are shifted in the area of the structure.

17. The magnetic memory according to claim 16, wherein the area of the structure is distant from the third magnetic layer.

* * * * *